US012718866B2

(12) United States Patent
Wang et al.

(10) Patent No.: US 12,718,866 B2
(45) Date of Patent: Aug. 25, 2026

(54) APPARATUSES, SYSTEMS, AND METHODS FOR DATA TIMING ALIGNMENT WITH FAST ALIGNMENT MODE

(71) Applicant: MICRON TECHNOLOGY, INC., Boise, ID (US)

(72) Inventors: Baokang Wang, Sagamihara (JP); Takuya Miyagi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 18/830,393

(22) Filed: Sep. 10, 2024

(65) Prior Publication Data

US 2024/0428844 A1 Dec. 26, 2024

Related U.S. Application Data

(63) Continuation of application No. 18/047,950, filed on Oct. 19, 2022, now Pat. No. 12,125,519.

(51) Int. Cl.
*G11C 11/4076* (2006.01)

(52) U.S. Cl.
CPC ................................ *G11C 11/4076* (2013.01)

(58) Field of Classification Search
CPC .................................................. G11C 7/1066
See application file for complete search history.

(56) References Cited

U.S. PATENT DOCUMENTS 5,299,159 A 3/1994 Balistreri et al.
11,830,538 B2 11/2023 Wang
11,854,601 B2 12/2023 Nakai et al.
2006/0250883 A1* 11/2006 Szczypinski ......... G11C 7/1066 365/194
2012/0194248 A1 8/2012 Magee et al.
2019/0303042 A1 10/2019 Kim et al.
2021/0134336 A1 5/2021 Na et al.
2022/0083260 A1 3/2022 Lee et al.
2023/0206984 A1 6/2023 Ang
2023/0206985 A1 6/2023 Nakai et al.
2024/0135984 A1 4/2024 Wang et al.
2024/0233806 A9 7/2024 Wang et al.

FOREIGN PATENT DOCUMENTS

CN 111312307 A 6/2020

* cited by examiner

*Primary Examiner* — Jason Lappas
(74) *Attorney, Agent, or Firm* — Dorsey & Whitney LLP

(57) ABSTRACT

Apparatuses, systems, and methods for data timing alignment with fast alignment mode. A stacked memory device includes an interface die and a number of core die. The interface and the core die each have an adjustable delay circuit adjusted by an interface delay code or a respective core delay code. The delay codes are adjusted based on a measured phase difference along a replica path. In a default maintenance state, the delay codes may be adjusted based on an average of the phase differences over time. Each time the phase difference matches a previous phase difference, the interface die changes a count value associated with that core die. If one or more of the count values cross a threshold, a state machine of the interface die enters a different delay adjustment state where averaging is not used. This may allow for correction of systemic errors such as voltage drift.

20 Claims, 9 Drawing Sheets

600

610

| | U | K | D |
|---|---|---|---|
| Slice0 | U | | |
| Slice1 | | K | |
| Slice2 | | K | |
| Slice3 | | K | |
| Slice4 | | K | |
| Slice5 | U | | |
| Slice6 | | K | |
| Slice7 | | K | |

CFAM Enable State5

620

| | U | K | D |
|---|---|---|---|
| Slice0 | U | | |
| Slice1 | | K | |
| Slice2 | | | D |
| Slice3 | | K | |
| Slice4 | | K | |
| Slice5 | U | | |
| Slice6 | | K | |
| Slice7 | | K | |

CFAM Enable State6

630

| | U | K | D |
|---|---|---|---|
| Slice0 | | | D |
| Slice1 | | K | |
| Slice2 | | | D |
| Slice3 | | K | |
| Slice4 | | K | |
| Slice5 | | | D |
| Slice6 | | K | |
| Slice7 | | K | |

CFAM Enable State5

640

| | U | K | D |
|---|---|---|---|
| Slice0 | | K | |
| Slice1 | | K | |
| Slice2 | | K | |
| Slice3 | | K | |
| Slice4 | | K | |
| Slice5 | | K | |
| Slice6 | | K | |
| Slice7 | | K | |

CFAM Disable State4

U: IF Slower than Core

D: IF Faster than Core

K: IF is Aligned with Core

FIG. 6

APPARATUSES, SYSTEMS, AND METHODS FOR DATA TIMING ALIGNMENT WITH FAST ALIGNMENT MODE

CROSS-REFERENCE TO RELATED APPLICATIONS

This application a continuation of U.S. patent application Ser. No. 18/047,950, filed Oct. 19, 2022. This application is incorporated by reference herein in its entirety and for all purposes.

BACKGROUND

This disclosure relates generally to semiconductor devices, such as semiconductor memory devices. A memory device may be a stacked memory device, in which a number of core dies, each containing a memory array are stacked on top of an interface die. The interface die may have terminals which connect to one or more external devices. The interface die may communicate with the core dies to perform various operations, such as read or write operations to the memory arrays in one or more of the core dies.

The core dies and interface die may be coupled by through silicon vias (TSVs). It may take time for information such as commands and/or data to propagate along the TSVs between the interface die and the core die. Different core dice may introduce different amounts of delay, for example due to process-voltage-temperature (PVT) variations between the core dice. Data from multiple core die may be provided along one or more shared TSVs and the different delays may introduce conflicts if the delays cause data to overlap from different core die. Each core die may include data aligner circuits to ensure that data from different core dice are aligned in time when they arrive at the interface die.

BRIEF DESCRIPTION OF THE DRAWINGS

FIG. 6 is a diagram of example sets of CFAM enable signals which may enable different states in a maintenance mode according to some embodiments of the present disclosure.

DETAILED DESCRIPTION

Figure 1:
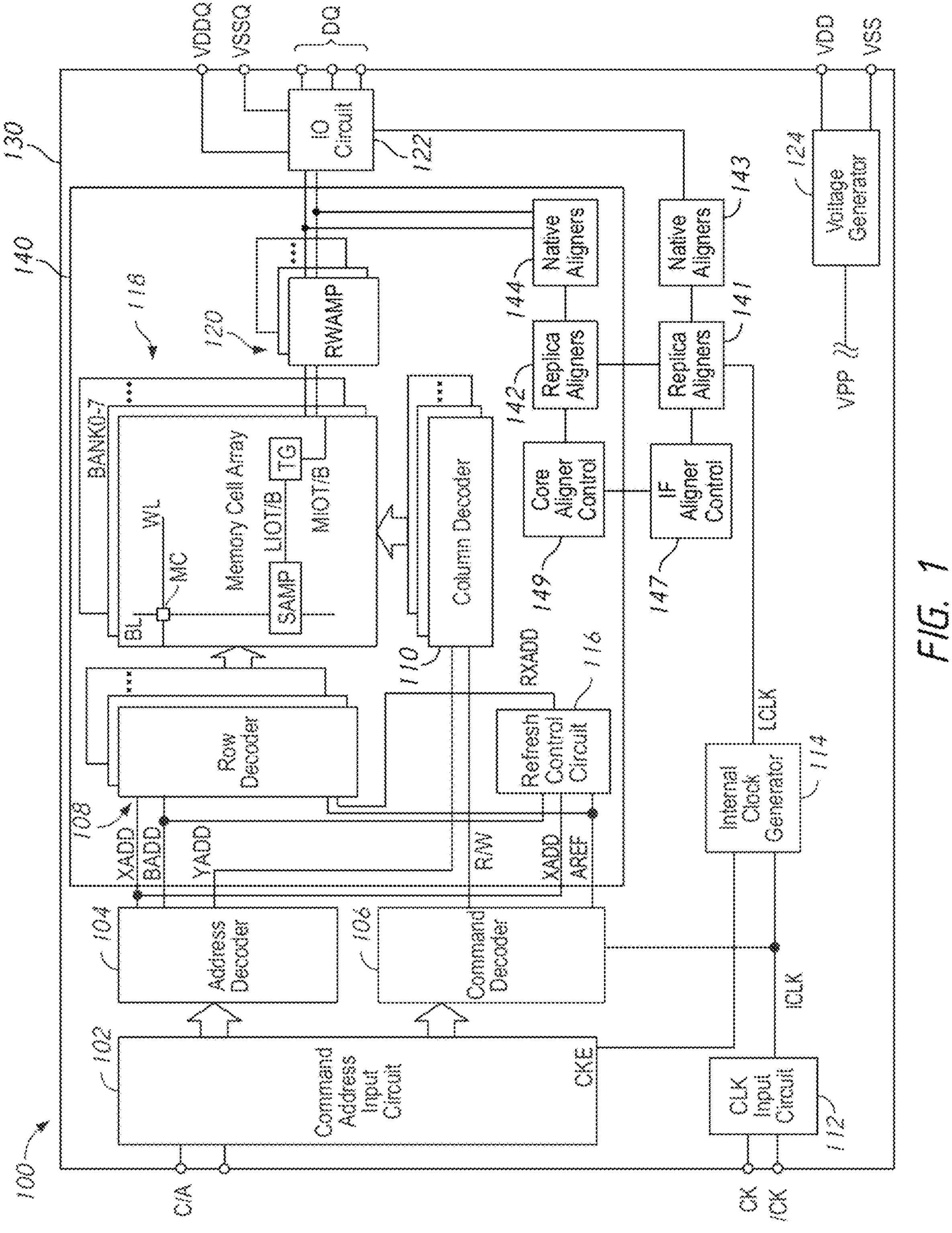
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a number of core dice, each including a memory array, stacked on an interface die, which communicates between external devices and the core dice. Each memory array which has a number of memory cells, each located at the intersection of a word line (row) and digit line (column). During an access operation such as a read or write operation, the interface die may receive a command and addresses which may specify memory cell(s) in one or more of the core dice. It may be important to align the timing of the data passing between the interface and core dice so that information reaches (and/or is received from) a given core die with predictable timing. Information should reach each core die (or be received from) each core die with approximately the same timing (e.g., timing which is within a tolerance of each other). However, since each core die may have different characteristics (e.g., PVT variations), it may take different amounts of time for information to pass between different core dies and the interface. To facilitate this and achieve timing alignment, alignment circuits may be used to impose delays. Different alignment circuits may be used in read and write paths of the device (e.g., there may be a read alignment circuit and a write alignment circuit). The core and interface dies may have a native path in which data and commands are transmitted, and a replica path designed to mimic the delays along the native path and used to determine a timing for alignment circuits in the native path.

The native delay path includes adjustable delay circuits in the interface die and in the core die. The replica path includes similar adjustable delay circuits and a phase detector. Along the replica path, a clock signal is passed through an interface delay circuit and along TSVs to a core delay circuit in the core die. A phase detector compares the delayed clock signal in the interface die to the delayed clock signal from the core die. Based on the measured phase difference from the phase detector, a state machine in a data aligner circuit of the interface die adjusts the delay in the replica and in the native path. The state machine may use various states or modes to determine how to adjust the delay in the interface die and the delays in the core die.

Once an initialization is complete, the state machine may enter a maintenance mode to make adjustments over time. For example, the maintenance mode may include a default maintenance state which makes adjustments based on averaging readings from the phase detector over time, and making fine adjustments to the delays based on the average of the readings. This may be useful if the changes to the delay are due to small random fluctuations. However, some situations, such as voltage drift, may introduce a larger systemic error. Adjustment based on averaging may generally be relatively slow, and so voltage drift and other systemic changes may not be corrected in a timely fashion. There may be a need to allow the data aligner to detect systemic errors while in the maintenance mode and enter additional states to correct the issue.

The present disclosure is drawn to apparatuses, systems, and methods for data timing alignment with fast alignment mode. The data aligner circuit in the interface die includes a number of counters, one for each core die. In the maintenance mode, each time the phase detector for that core die updates its value (e.g., after each averaging window) the new value is compared to the previous value. If they are the same, then the counter for that core die updates a count value (e.g., by incrementing it). If they are different, then the count value is not changed. The count value is compared to a threshold, and once the count value crosses the threshold, one or more counter-based fast alignment modes (CFAM) is entered from a default maintenance state. The CFAM's may rapidly adjust the delay codes (e.g., without averaging). In this way, if the problem is systemic over a relatively long time (e.g., the phase detector consistently reads that the phase is low or high) then one or more rapid adjustment modes are entered to correct for the issue. Once the delays are aligned, the state machine may return to the default maintenance state, and the counter may be reset.

FIG. 1 is a block diagram of a semiconductor device according an embodiment of the disclosure. The semiconductor device 100 may be a semiconductor memory device, such as a DRAM device. The DRAM device may include an interface die and a plurality of core dice which are stacked on the interface die. In the example diagram of FIG. 1, certain components are shown located on an interface die 130, while other components are shown as part of each of the core dice 140. For the sake of clarity, only a single core die 140 and its components are shown, however, there may be multiple core die (e.g., 2, 4, 6, 8, 16, or more) each with similar components to each other. The example device 100 of FIG. 1 shows a particular arrangement of components between the interface die 130 and core die 140, however other arrangements may be used in other embodiments (e.g., the refresh control circuit 116 may be on the interface die 130 in some embodiments). For the sake of illustration, the core die 140 is drawn as a box which is smaller than the interface die 130, however the core die 140 and interface 130 may have any size relationship to each other. For example, the core die and interface die may be approximately the same size.

The semiconductor device 100 includes a memory array 118 on each of the core dice 140. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110, each of which may also be located on each of the core dice. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) of the memory array 118. Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to a read/write amplifier (RWAMP) 120. Conversely, write data outputted from the RWAMP circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals located on the interface die 130 that include command and address (C/A) terminals coupled to a command and address bus to receive commands and addresses, and a CS signal, clock terminals to receive clocks CK and/CK, data terminals DQ to provide data, and power supply terminals to receive power supply potentials VDD, VSS, VDDQ, and VSSQ.

The clock terminals on the interface die 130 are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The internal clocks LCLK may include a read clock (RCLK) which is used to control the timing of read operations, and write clock (WCLK) which is used to control the timing of write operations. The internal clocks may be passed both to the I/O circuits 122 and also to internal components of the core dice 140 such as the RWAMP 120. Different ones of the core dice 140 may have different amounts of time lag (e.g., due to different temperatures of the different core dice, different distances from the interface die 130 etc.). The memory 100 includes a native path. Each of the core dice 144 may have nave aligners 144 along read and write native paths. The interface die 130 also has native aligners 143 which receive a clock signal (e.g., LCLK) and provide a delayed clock to the IO circuit 122 of the interface die 130. The native aligners include one or more delay circuits which may add a configurable about of delay time to the signals in the core die 140. The amount of delay in the native aligners 143 and 144 may be managed to control the timing at which data is provided to the IO circuit 122. For example, the native aligner 144 may provide a delayed signal which is used to determine when the core die 140 provides the data, and the native aligner 143 provides a delayed signal which is used to determine when the IO circuit 122 latches the data provide by the core die 140.

The core die 140 may also include a replica path, which includes replica aligners 142 in each of the core die and replica aligners 141 in the interface die. The replica path may be used to measure the amount of delay in that die in order to adjust the amount of delay in the native aligners 143 and 144. Similar to the native path, the replica path may also include delay circuits which may be adjusted to determine a proper length of delay. The internal clock generator 114 provides an oscillator signal to replica aligners 141 of the interface die 130 and replica aligners 142 of the core die. An interface aligner control circuit 147 measures a difference between the delayed oscillator signal from these two aligners 141 and 142 (e.g., with a phase detector) and uses that measured difference to set a delay in the replica aligner 141 and native aligner 143 of the interface die 130, and instructs a core aligner control circuit 149 to adjust the replica 142 and native aligners 144 of the core die 140.

The interface aligner control circuit 147 includes a state machine, which may control the behavior of the interface aligner control circuit 147 and the core aligner control circuit 149. For example, different modes may involve adjusting the replica aligners 141 and 142 with coarse alignment or fine alignment, and/or the native aligners with coarse or fine alignment. In some embodiments, as described in more detail herein, the interface aligner control circuit 147 includes counters for each of the core die 140. The counters may be used to track when the phase detector for that core die has a same value for a threshold amount of time. The counters may be used to enter the aligner control into one or more counter-based fast alignment (CFAM) mode. For example, the counters may be adjusted during a default maintenance state of the device. If the phase detector value matches a previous phase detector value, the count value for that die may be changed (e.g., increased). In some embodiments, since averaging is used, the count value may be increased by an amount which reflects the size of the averaging window. If the phase detector value does not match the previous phase detector value, then the count may be reset.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifier 120. The read data may be latched in a core die data latch (not shown) with timing based on the clock signal delayed by the native aligners 144. The read data is received by data latches of the IO circuit 122 with timing based on the clock signal delayed by the native aligners 143. The read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to RWAMP 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 RWAMP 120.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
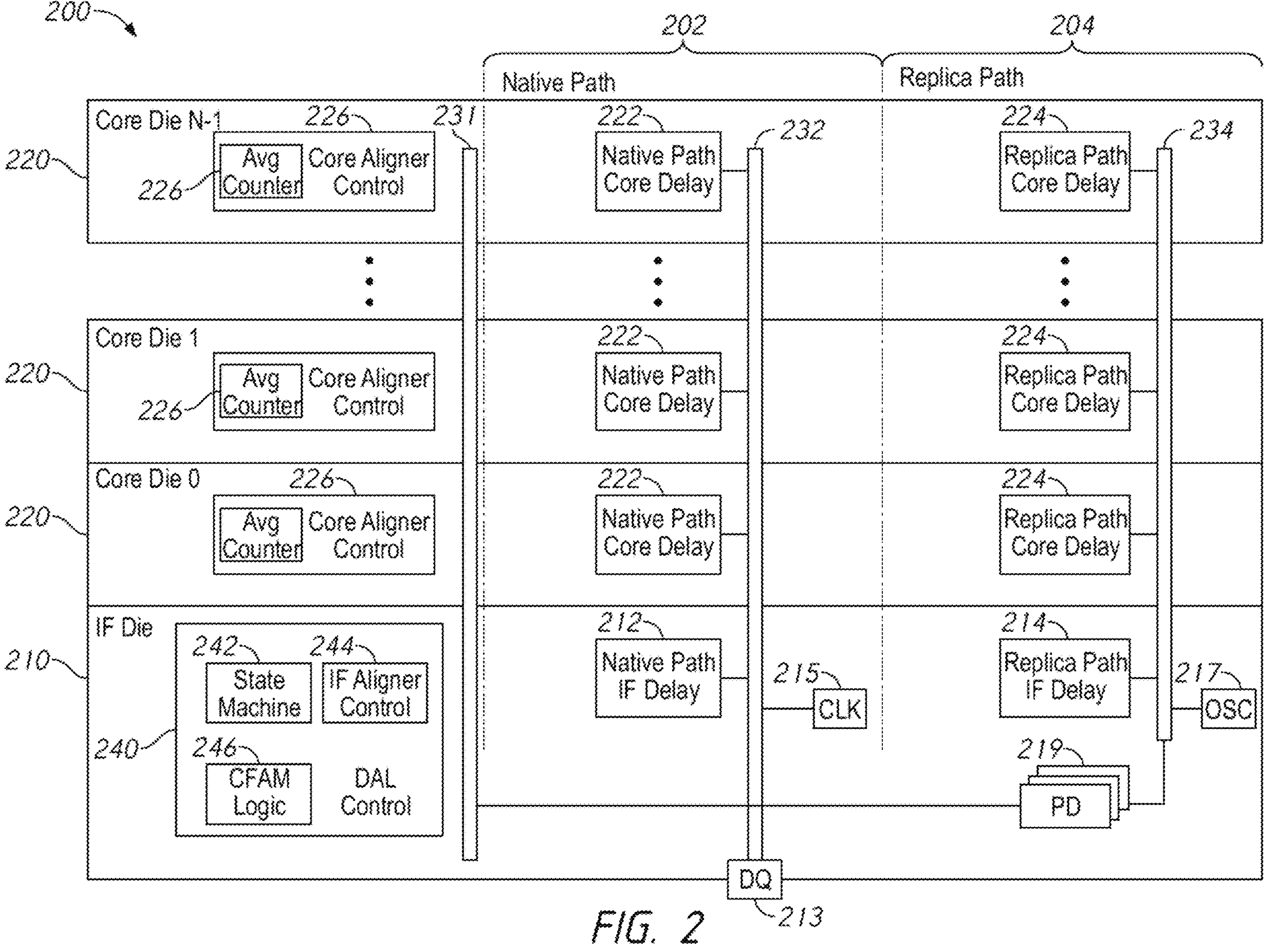
FIG. 2 is a block diagram of a memory device according to some embodiments of the present disclosure.

FIG. 2 is a block diagram of a memory device according to some embodiments of the present disclosure. The memory device 200 may, in some embodiments, represent a cross sectional view of a memory device such as the device 100 of FIG. 1. The memory device 200 includes an interface (IF) die 210, and a number of core dice 220 which are stacked on the interface die 210. Here the core dice 220 are labelled core die 0 through core die N−1 for a total of N core dice.

The interface die 210 may have a number of terminals to couple the device 200 to external devices. For example, the interface die 210 may include terminals such as clock terminals, power terminals, data terminals DQ 213, command terminals, etc. The core dice 220 may be coupled to the interface die 210 by one or more through silicon vias (TSVs) which may penetrate the stack and carry commands, signals, and/or data between the core dice 220 and the interface die 210. In FIG. 2, three sets of TSVs are shown, control path TSV 231, native path TSVs 232, and replica path TSVs 234. The TSVs 231, 232 and 234 include one or more signal lines which connect the different dice of the device 200 to each other. While the control path TSVs 231, native path TSVs 232 and replica path TSVs 234 are shown separately, in some embodiments, certain signal lines may be shared between the two TSV groups.

As may be seen, dice which are higher in stack (e.g., Core Die N−1) can be further from the interface die 210 than dice which closer (e.g., Core Die 0). In addition, different core dice 220 may have different temperatures, manufacturing variations etc. which may also adjust the travel time of information such as signals and data between the core die 220 and the interface die 210. There may thus be different propagation times between the interface die 210 and different ones of the core dice 220. To prevent misalignment of signals and/or data being conveyed in the device 200, aligner circuits may be used to provide adjustable delays along native signal paths 202 in the core dice 220 and interface die 210. These delays may be adjusted based on measured signal alignment along a replica path 204, which may include circuits meant to mimic the timing along a native path 202.

The native path 202 may include native path TSVs 232 which convey information (e.g., signals such as commands and clock signals and data) between the memory arrays of the core dice 220 and the interface die 210. The replica path 204 may include replica path TSVs 234 and other circuits which are meant to mimic an amount of time it takes signals and data to propagate along the native path 202. Both the native path 202 and the replica path 204 may also include variable delay circuits which may be adjusted to align signal and data propagation time between the different core dice 220. For example, the native path 202 includes native path delay circuits 222 (e.g., 144 of FIG. 1) in the core dice 220 and native path delay circuits 212 (e.g., 143 of FIG. 1) in the IF die 210, while the replica path 204 includes replica path delay circuits 224 (e.g., 142 of FIG. 1) in the core dice 220 and replica path delay circuits 214 (e.g., 141 of FIG. 1) in the IF die 210. A delay in signal propagation along the replica path 204 may be measured to align delays in the native path 202. For example, the IF die 210 includes a number of phase detector (PD) circuits 219 which measure a difference between an oscillator signal from an oscillator circuit 217 after it propagates through the core replica delay 224 and the interface replica delay 214. The measured phase differences from the PD circuits 219 are provided to a data aligner control circuit 240 of the interface die 210, which sets delays in the interface die and delays in each of the core dies 220 based on the measured phase differences.

Each of the delay circuits 211, 212, 222, 214, and 224 may include one or more variable delay circuits which may be adjusted based on a control circuit. An IF aligner control 244 may control adjustments in the delay circuits 212 and 214 of the IF die 210, while core aligner controls 226 may control adjustments in the delay circuits 222 and 224 of the core dice 220. For the sake of clarity, signal lines have been simplified and/or omitted in FIG. 2 which show how the aligner control circuits 216 and 226 are coupled to the delay circuits 212, 222, 214, and 224.

The data aligner control circuit 240 includes an interface die aligner control circuit 244, a state machine 242 and CFAM logic 246. The state machine 242 sets a current state of the memory device 200 which determines how the delay values for the core and native path should be adjusted. The interface aligner control 244 sets a delay code which determines a delay in the interface native delay circuit 212 and the interface replica delay circuit 214. The CFAM logic 246 is used to monitor the signals from the phase detectors 219 when the state machine 242 is in a maintenance mode to determine if a fast alignment mode should be entered.

The control TSVs 231 may be used to convey information between the control circuits 226 in the core die 220 and the data aligner control circuit 240 in the interface die 210. For example the control TSVs 231 may be used to convey information such as signals which indicate which state the state machine 218 is in, identification info which indicates which of the core dice 220 is being adjusted, and/or other related signals.

As shown in the example of FIG. 2, the native path 202 includes data terminals DQ 213, which are coupled to memory arrays in the core dice 220 by the native path TSVs 232. The native path TSVs 232 also distribute clock signals from a clock circuit 215 (e.g., internal clock generator 114 of FIG. 1), which may generate internal clock signals based on an external clock (not shown). The clock signals provided by the clock circuit 215 may control the timing of operations between the interface die 210 and the core dice 220. The replica path 204 may include replica path TSVs 234 which provide an oscillator signal OSC from an oscillator circuit 217 of the interface die 210 to delay circuits 224 of the core dice 220. The oscillator signal may be passed through one or more delay circuits 214 and 224. The state machine 218 may adjust the delays in the delay circuits 214 and 224 of the replica path 204 and measure an alignment of the oscillator signal. Based on that values in the replica path 204 which bring alignment, the delay values in the native path 202 may also be adjusted. For example, the delay values may be matched between the replica and native paths.

In an example write operation, data may be provided at the DQ terminal 213 and then passed along the TSVs 232 to one or more selected ones of the core dice 220. The clock circuit 215 may provide a write clock, which may be adjusted by the native path interface delay to provide a delayed interface write clock. The delayed interface write clock may be used to determine the timing with which the data from the DQ pads 213 is provided along the TSVs 232 to the selected one(s) of the core dice 220. The write clock may also be passed up the TSVs 232 to the native path core delay circuits 222 in the selected one(s) of the core dice 220, which may provide core delayed write clock signal(s). The core delayed write clock signals may determine the timing with which the data along the TSVs 232 is received. Based on the propagation of the oscillator signal OSC from the oscillator circuit 217, the state machine 218 may adjust the delays in the native path 202 to ensure that the write data reaches the memory array in alignment with the write clock.

The data aligner control circuit 240 in the interface die 210 operates control circuits 216 and 226 in the interface 210 and core dice 220 respectively. The control circuits 216 and 226 may adjust delays in replica paths 214 and 224 of their respective dies. The state machine 242 may control which circuits and which delays are being adjusted and monitor the measured alignments. The delays set in the replica path 204 may also be applied to the alignment circuits 212 and 222 in the native path 202. Once the measured alignments are within tolerances, the delays may bring the device 200 into timing alignment. Each of the core dice 220 and the IF die 210 may have different delays from each other.

The state machine 218 may update the delay values as part of an ongoing process in the memory device 200. For example, the state machine 218 may use an initial set of states to establish delays in the interface aligner control circuit 216 and in each of the core aligner control circuits 226. After the initial states, the state machine 218 may operate a maintenance mode which keeps the delays in alignment. The state machine 218 may enter a default maintenance state after the initialization. To prevent unnecessary adjustment, the default maintenance state may use averaging to determine when a delay value has shifted out of alignment. Each of the core aligner control circuits 226 includes an averaging counter used to average signals from the respective phase detector 219 over time.

The data aligner control 240 includes CFAM logic circuits 246. The CFAM logic circuits 246 include a counter for each of the core dice 220. Each counter stores a count value associated with one of the core dice 220. The CFAM logic 246 receives the measured phase signals from each of the PD circuits 219. During the default maintenance state, each time the value of PD is updated (e.g., after each averaging window), the new value of the phase signal is compared to a previous value. If the values are different, then the count value is reset to an initial value (e.g., reset to 0). If the values are the same, the count value is changed (e.g., increased). If the count value crosses (e.g., meets or exceeds) a threshold, then the state machine may move to from the default maintenance state to a new state (e.g., a CFAM state) where rapid changes (e.g., without averaging) to the core and/or interface delays are mode. Once the delay is aligned again, the state machine 242 may return to the default maintenance state.

The state machine 242 may also define underflow and overflow limits. When one of these limits is exceeded, the state machine 218 may shift to a rapid alignment mode, including a state where the delay in the interface aligner control 244 is adjusted, followed by a process where the delays in the core aligner control circuits 226 in each of the core dice 220 is adjusted without averaging. Once the state machine 218 determines that the overflow/underflow conditions are no longer met, the state machine 218 may return to the maintenance state.

In some embodiments, the delays in the native path circuits 212 and 222 and in the replica path delay circuits 214 and 224 may be divided between a read path and a write path. For example, the delay circuits may each include one or more read path delay circuits and one or more write path delay circuits, each of which may have their own separate delay values. Similarly, the state machine 218 may have a first process for setting values in the read path and a second process for setting delay values in the write path.

Figure 3:
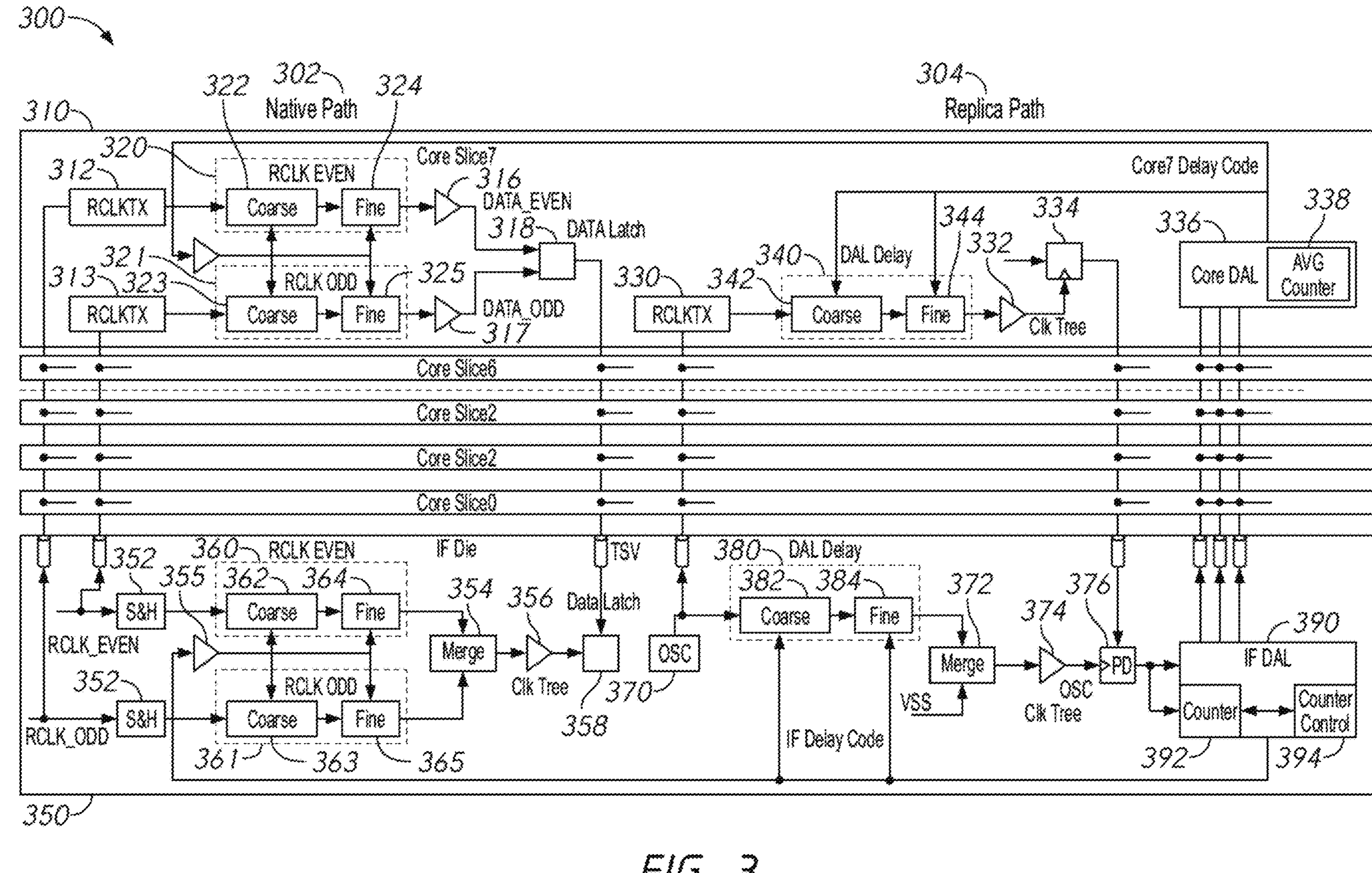
FIG. 3 is a schematic of a stacked memory device according to some embodiments of the present disclosure.

FIG. 3 is a schematic of a stacked memory device according to some embodiments of the present disclosure. The memory device 300 may, in some embodiments, be included in the memory device 100 of Figure and/or 200 of FIG. 2. The memory device 300 includes an interface die 350 (e.g., 130 of FIGS. 1 and/or 210 of FIG. 2) and a number of core dice stacked on top of it, such as core die 310 (e.g., 140 of FIGS. 1 and/or 220 of FIG. 2). For the sake of brevity, only a single core die is discussed in detail with respect to FIG. 1 (here labelled Core slice 7), however, the other core die may have similar components to those discussed with respect to the core die 310. FIG. 3 is focused on components related to data alignment and especially a CFAM mode. Other components and signals may be omitted or simplified in FIG. 3.

The memory device 300 includes a native path 302 and a replica path 304. The native path conveys a clock signal from the interface die 350 to the core die 310 which is used to time data to or from interface die 350. In the example of FIG. 3, a read path is shown where a read clock RCLK is used to time the receipt of data from the core die 310 to the interface die 350. While FIG. 3 is discussed with respect to read operations, the device may also include paths for write paths.

The interface die 350 provides a divided read clock RCLK_EVEN and RCLK_ODD. The two read clocks may be divided from an original single clock signal RCLK (not shown). The read clock may be part of the clock signal LCLK generated by an internal clock circuit (e.g., 114 of FIG. 1). The two read clocks may have a similar period, but may be complimentary to each other (e.g., 180° out of phase). The two read clocks are provided through core native delay circuits 320 and 321 (e.g., 144 of FIGS. 1 and/or 222 of FIG. 2) of the core die 310 to time the receipt of data from the memory array (not shown in FIG. 3) and through interface native delay circuits 360 and 361 (e.g., 143 of FIGS. 1 and/or 212 of FIG. 2) to a data latch 358 which receives the data from the core die 310 with timing based on the read clocks. The data in the data latch 358 may then be provided off the device (e.g., to DQ terminals of the device).

The read clocks RCLK_EVEN and RCLK_ODD are provided from the interface die 350 along TSVs to respective receiver circuits 312 and 313 of the core die 310. Each receiver circuit 312 and 313 provides its respective read clock to a respective delay circuit 320 or 321. For example, an even delay circuit 320 receives RCLK_EVEN from even receiver 312 and an odd delay circuit 321 receives RCLK_ODD from odd receiver 313. Each delay circuit 320 and 321 provides a variable amount of delay based on a delay code Core7 Delay Code provided by an aligner control circuit 336 (e.g., 226 of FIG. 2) of the core die 310. A buffer 314 provides the Core7 Delay Code to the delay circuits 320 and 321

Each delay circuit 320 includes a coarse adjustment circuit 322 and 323 respectively and a fine adjustment circuit 324 and 325 respectively. The coarse adjustment circuits 322 and 323 may be used to make relatively large adjustments to the total amount of delay, while the fine adjustment circuits 324 and 325 may make relatively small adjustments to the total amount of delay. The Core7 Delay Code may specify a number of delay elements in the coarse adjustment circuits 322 and 323 and in the fine adjustment circuits 324 and 325 which should be active.

The delay circuits 320 and 321 provide the delayed read clocks through respective clock trees 316 and 317 to data latch 318. The data latch 318 may be coupled to a memory array (not shown) and may latch data based on both of the delayed clock signals. For example, odd data bits DATA_ODD may be latched responsive to rising edges RCLK_ODD and even data bits DATA_EVEN may be latched responsive to rising edges of RCLK_EVEN. The merged data bits are provided along TSVs back to the interface die 350.

In the interface die, the divided read clocks RCLK_EVEN and RCLK_ODD are provided through respective set and hold circuits 352 and 353 to respective native interface delay circuits 360 and 361. The native interface delay circuits 360 and 361 are similar to the native core delay circuits 320 and 321. The native interface delay circuits 360 and 361 provide a variable amount of delay based on an interface delay code IF Delay Code provided by an interface delay control circuit which may be part of the data aligner control circuit 390 (e.g., interface delay control circuit 244 of FIG. 2). The IF Delay code is provided via a buffer 355.

Each of the delay circuits 360 and 361 includes a respective coarse delay circuit 362 and 363 and a respective fine delay circuit 364 and 365, similar to the delay circuits 320 and 321. The delay circuits 360 and 361 provide their respective delayed clock signals to a merge circuit 354, which combines the even and odd clock signals back into a single read clock RCLK. The merged read clock is passed through a clock tree 356 to a data latch 358 (e.g., part of IO circuit 122 of FIG. 1). The data latch 358 in the interface die 350 receives the data along TSVs from the data latch 318 in the core die 310. The data is latched with timing based on the merged read clock. The delay codes Core7 Delay Code and IF Delay Code may be ideally set such that the provided data is aligned with the timing merged clock signal.

The memory device 300 also includes a replica path 304, which is used to measure a replica of delays along the native path 302, in order to determine if the delay codes are properly set, and to allow them to be adjusted until they are in alignment. The replica path 304 includes an oscillator circuit 370 which provides an oscillating signal which mimics the read clocks of the native path. The oscillator circuit 370 provides the oscillating signal from the interface die 350 along TSVs to a receiver 330 of the interface die. The receiver 330 passes the oscillating signal to a delay circuit 340. The delay circuit 340 has coarse and fine adjustment circuits 342 and 344 and mimics the delay circuits 320 and 321. The delay circuit 340 receives the delay code Core7 Delay Code from the core data aligner control circuit 336. The delay circuit 340 (e.g., 142 of FIGS. 1 and/or 224 of FIG. 2) provides a delayed oscillator signal through a replica clock tree 332 (which replicates the clock trees 316 or 317) to a latch 334. The latch 334 mimics the data latch 318. The latch 334 provides mock data along a TSV to the interface die 350.

In the interface die 350, the oscillator signal is provided to a delay circuit 380, which mimics the delay circuits 360 and 361. The delay circuit 380 (e.g., 141 of FIGS. 1 and/or 214 of FIG. 2) includes coarse and fine delay adjustment circuits 382 and 384 which provide an amount of delay based on the signal IF Delay Code. The delayed oscillator signal is passed through a merge circuit 372 and clock tree to a phase detector 376. The merge circuit 372 mimics the merge circuit 354 in the native path 302. However, since the oscillator signal is not divided, a fixed system voltage (e.g., a ground voltage such as VSS) may be fed through the other input of the merge circuit 372. The clock tree 374 may mimic the clock tree 356 of the native path 302.

The phase detector 376 measures a difference in the timing at which the mock data is received along TSVs from the latch 334 in the core die and the timing of the oscillator signal OSC received from the clock tree 374. The phase detector 376 provides a signal which indicates the measured difference. In some embodiments, the phase detector 376 provides a binary signal, which has a first state (e.g., a logical low) if the oscillator signal OSC arrives before the mock data and a second state (e.g., a logical high) if the mock data arrives before OSC.

The phase detector signal (along with the signals from the other phase detectors for the other core die) is provided to a data aligner control circuit 390 (e.g., 240 of FIG. 2). The data aligner control circuit 390 controls the behavior of the interface delay control and core die control 336 based on a state machine (not shown in FIG. 3). For example, in some embodiments, the data aligner control circuit 390 may pass the phase detector signal to the core die aligner circuits 336 and the core data aligner circuits 336 may respond to those signals based on the state indicated by the state machine in the data aligner control circuit 390. In some embodiments, the data aligner control circuit 390 may pass more direct controls (e.g., increase delay/decrease delay) to the core data aligner circuits 336.

In some states, the device 300 may be in a state where averaging is used. Each of the core data aligner control circuits 336 may include an averaging counter 338. The averaging counter 338 may average a number of different states of the PD signal associated with that core die 310 to find an overall result. Based on the overall result, the delay code (e.g., Core7 Delay Code) may be adjusted. In other states, averaging may not be used and the PD signals may be used directly to determine how to adjust the delay code.

The data aligner control 390 includes CFAM logic (e.g., 246 of FIG. 2) such as counters 392 and counter control circuits 394 for each of the core die 310. The counter 392 compares the current state of the PD signal to a previous state of the PD signal, and changes the count value if they are the same. If they are different the count value is reset to an initial value (e.g., 0). The counter control circuit 394 determines if the value of the counter 392 has crossed a threshold, and responsive to the counter crossing the threshold, a different state, such as a CFAM state, may be used for adjusting the delay codes.

Figure 4:
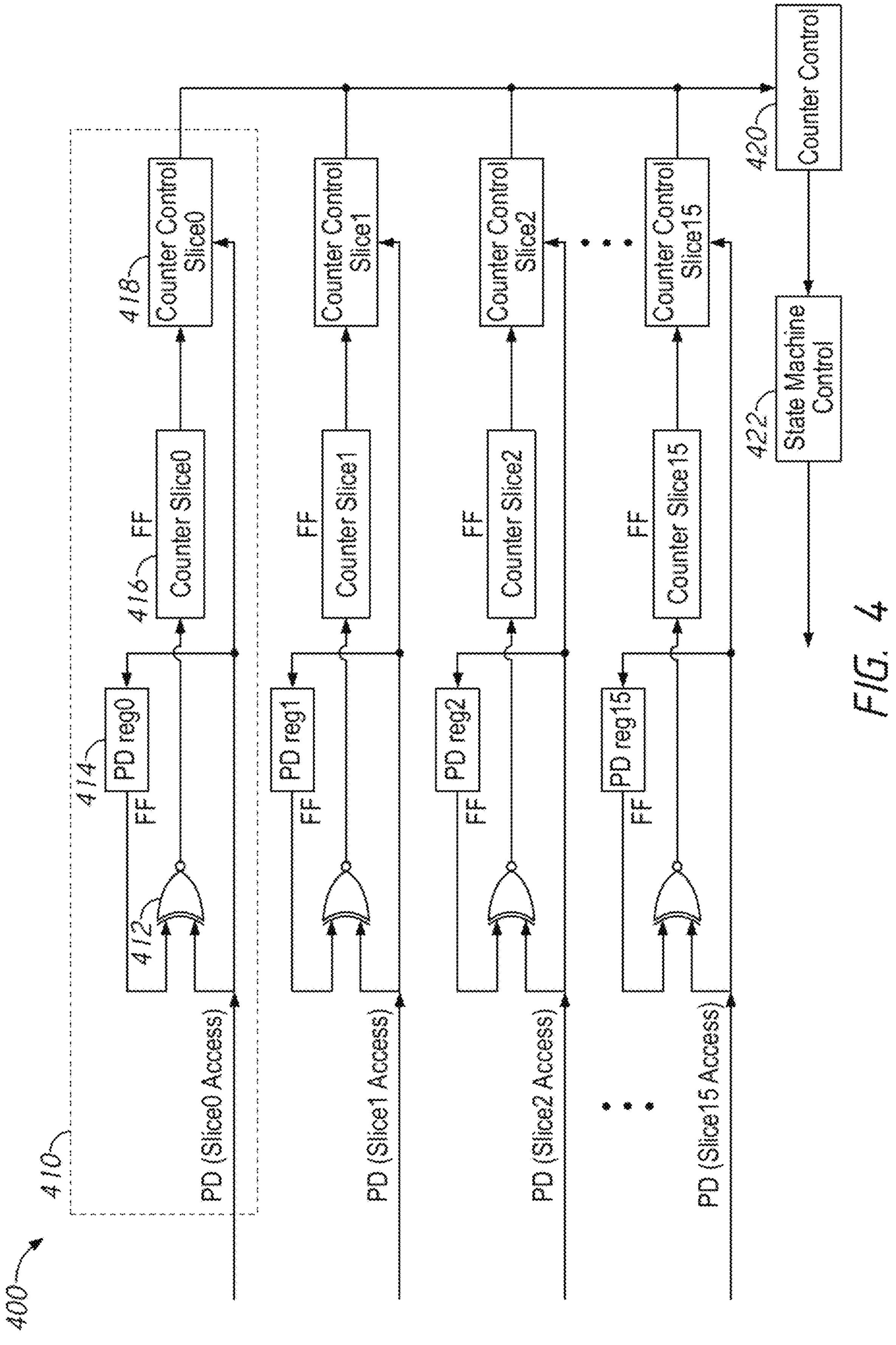
FIG. 4 is a block diagram of CFAM logic according to some embodiments of the present disclosure.

FIG. 4 is a block diagram of CFAM logic according to some embodiments of the present disclosure. The CFAM logic 400 may, in some embodiments, be part of an interface die data aligner control circuit such as 147 of FIG. 1, 240 of FIG. 2, and/or 390 of FIG. 3. The CFAM logic 400 includes core CFAM logic 410 for each of the core dice of the memory device. Since the different core CFAM logic may generally be similar to each other, only one will be described in detail. The CFAM logic 400 also includes components of the aligner control logic, such as the counter control circuit 420 and state machine 422 which are shared between multiple core die.

Figure 5:
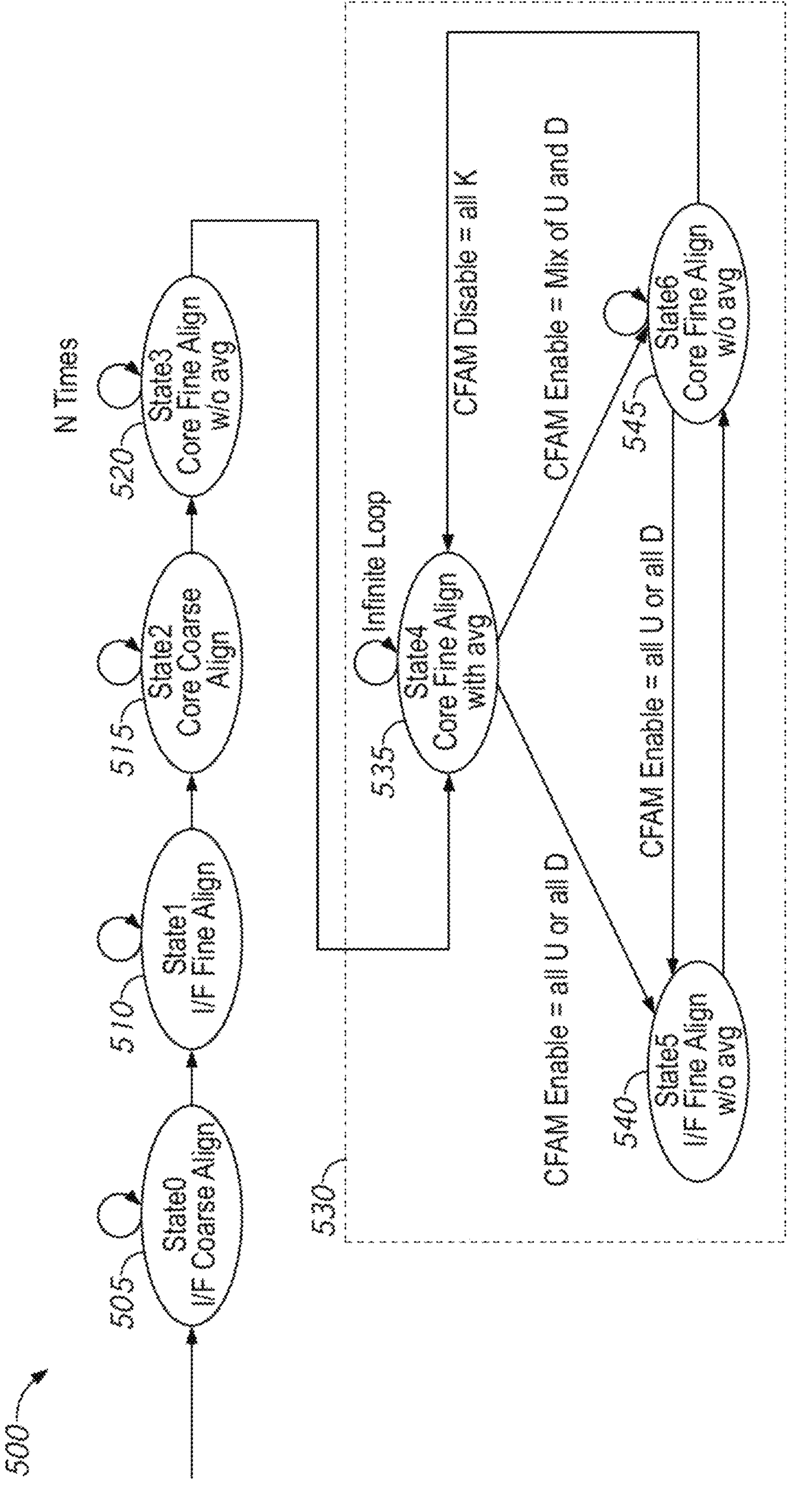
FIG. 5 is a flow chart of a state diagram according to some embodiments of the present disclosure.

Each of the core CFAM logic 410 circuits provides a signal which indicates a state of the measured phase difference (e.g., from the PD circuit) over time. When the state of the PD signal is changing over time, the core CFAM logic 410 provides a signal with a first state (herein designated "K" for keep). When the associated core die has had a same phase difference for at least a threshold amount of time, the core CFAM logic 410 provides a signal which indicates which direction the delay should be adjusted. For example a second state (herein designated "U" for up) may be used if the IF is faster than the core (e.g., OSC is arriving before the mock data) and a third state (herein designated "D" for down) may be used if the core is faster than the IF die. The counter control circuit 420 may receive the signals from each of the core CFAM logic circuits 410 and pool the results (e.g., either U, K, or D for each slice). Based on those results, the state machine 422 may select a state for adjustment. For example, if at least one slice has a signal in a U or D state, then a CFAM mode is entered where averaging is not used to adjust the delays. If all of the signals are in the K state, then a mode may be entered where averaging is used. FIG. 5 describes the states of a state machine in more detail.

Each core CFAM logic circuit 410 includes a register 414 which stores a previous value of the PD signal, a comparator logic circuit 412, a counter 416, and a counter slice control circuit 418. The comparator logic circuit 412 receives a signal PD from phase detector associated with the same slice as the core CFAM logic circuit 410 as an input. The comparator 412 also receives a previous value of PD stored in the register 414 as an input. In some embodiments, the comparator 412 may be an XNOR gate, which may return a logical high value if the two inputs are the same, and a logical low if the two inputs are different. If the comparator 412 indicates that the two inputs are the same, then the counter 416 may change a count value (e.g., by increasing it). In some embodiments, the counter 416 may change the count value by a different amount if the state machine 422 indicates a mode with averaging than if a mode with averaging is not used. For example, if the averaging window is 4 rising edges of the clock signal, then when averaging is used, the counter 416 may be increased by 4, and when averaging is not used, the counter may be increased by one. After the comparison, the current value of PD is stored in the register 414 for the next comparison.

The counter 416 compares the stored count value to a threshold. When the count value crosses (e.g., meets or exceeds) the threshold, the count circuit sends a signal to the counter control circuit 418, which checks the status of the PD signal. If the count value does not cross the threshold, then the counter control circuit 418 continues to provide a signal with a value K. If the count does exceed the threshold, then the counter control circuit 418 provides either U or D, with a value based on the current value of PD. For example, if the PD signal is a logical high, then D may be provided, and if it is a logical low, then U may be provided.

If there is not a match between the value stored in the register 414 and the current PD value, then the counter 416 may be reset to an initial value. In this manner, the count value for each slice may only reach the threshold if the PD signal has had the same state for at least that amount of time (e.g., as measured in cycles of an oscillating signal, such as the clock signal and/or oscillating signal OSC of FIG. 3).

FIG. 5 is a flow chart of a state diagram according to some embodiments of the present disclosure. The flow chart 500 may, in some embodiments, be implemented by a state machine (e.g., 242 of FIG. 2, and/or 422 of FIG. 4) as part of a data aligner control circuit (e.g., 147 of FIG. 1, 240 of FIG. 2, and/or 390 of FIG. 3). The chart 500 represents delay adjustment states of a memory device used to adjust the aligner delays, and may represent different states that a state machine can implement. Each state may represent one or more ways of performing adjustment to aligner delays, and one or more different criteria may be used to transition from one state to another.

The flow chart 500 includes a number of states 505-520 that may be part of an initialization mode of the memory. The initialization mode may be used to establish an aligner delay, for example after a power up or reset of the memory. After the initialization mode the memory may enter a maintenance mode 530. The maintenance mode may be used to monitor the alignments established during the initialization mode and ensure that the delays remain aligned within a tolerance. The maintenance mode 530 includes several states, including a default maintenance state 535 and two CFAM states 540 and 545. More or fewer CFAM states may be used in different embodiments.

As part of an initialization (e.g., after a reset or power up) the state machine enters an initial state State0 505. As part of State0 505, the state machine has the interface aligner control (e.g., 224 of FIG. 2) use the coarse adjustment (e.g., adjusting the IF delay code to adjust the delays 362, 363, and 382 of FIG. 3) to align based on the measured PD code. After the initial state 505 is repeated a number of times, the state machine may proceed to a first state State1 510. As part of the first state 510, the fine component of the IF delay code may be adjusted (e.g., to adjust the delays 364, 365, and 384 of FIG. 3).

After the first state 510 is repeated a number of times, the state machine enters a second state 515. As part of the second state, the state machine may instruct the core aligner control circuits (e.g., 226 of FIG. 2) to begin adjusting the core delay codes based on the measured PD signal. The state 515 includes adjusting a coarse portion of the core delay code (e.g., to adjust delay circuits 322, 323, and 342). After the second state 515 is repeated a number of times, a third state State2 520 is entered. The third state 520 may be generally similar to the second state 515, except that a fine portion of the core delay codes is adjusted (e.g., to adjust the delay 324, 325, and 344 of FIG. 3). The third state 520 involves adjusting the core die fine delays without averaging. In other words, during the state 520, the core die fine delay codes may be adjusted responsive to each new reading from the phase detector (e.g., with each cycle of the oscillator signal). The third state 520 may be repeated a number of times, such as N times. In some embodiments, the state 520 may be repeated more than the other initialization states.

After repeating the state 520, the state machine may enter a default maintenance state 535 of a maintenance mode 530. The state machine may generally remain in the maintenance mode 530 for example, until a next power up/reset of the device resets the state machine to the initial state 505.

During the default maintenance state 535 (e.g., State4), the core die fine alignment may be adjusted with averaging. This process may be generally similar to State3 520, except that as part of State4, averaging is used. During the default maintenance state 535, an averaging counter in each of the core aligner control circuits 226 may average the readings from the PD for that core die over an averaging window. At the end of an averaging window, a signal may be output and that averaged signal may be used to determine how to adjust the delay code. The averaging window may be based on a number of cycles of the oscillating signal in some embodiments. For example, an averaging window of 4 may be used. Other averaging windows (e.g., 2, 6, 8, 16, etc.) may be used in other example embodiments. The use of averaging may help slow down the rate at which the delay code is adjusted, which may be useful if the fluctuations in the alignment are relatively small and random. However, if the changes are systemic (e.g., consistently in a single direction for a relatively long time) such as due to voltage drift, then the speed at which the delay code is adjusted may become a problem.

During the maintenance mode 530, CFAM logic (e.g., 246 of FIG. 2) may keep count values for each of the core die. The count value may be used to generate a CFAM enable signal for each of the core die. As described with respect to FIGS. 3-4, the CFAM enable signal for each die may have one of three states, an inactive state 'K' if the count value has not reached a threshold (e.g., the PD signal is fluctuating over time), an active state 'U' if the count value has reached the threshold and interface die is slower than the core die (e.g., the PD signal is 0), or an active state 'D' if the count value has reached the threshold and interface die is faster than the core die (e.g., the PD signal is 1). If all of the CFAM enable signals are in the 'K' state then the state machine may remain in State4 535. If any of the CFAM enable signals are in the U or D state, then the state machine may enter a CFAM state 540 and/or 545.

If at least one CFAM enable signal has the U state or the D state, and all of the CFAM enable signals which are not in the K state have the same state (e.g., all the CFAM enable signals are either U or K or all the CFAM enable signals are either D or K), then the CFAM State5 540 may be entered. These conditions may be referred to as an 'all U' condition or an 'all D' condition. However these conditions do not require that every core die to provide a U or a D, just that at least one die provides a non-K state, and that all of the die providing a non-K state have the same non-K state. For example, a single die providing a U while the rest are K's would still count as an 'all U' condition.

In State5 540, the interface die fine alignment may be adjusted (without averaging). The State5 540 may generally be similar to first state State1 510. The count values and thus the CFAM enable signals may be adjusted during State5. Once an adjustment has been performed as part of state5 540, the state machine may transition to state6 545. During state 540, whether the CFAM enable signals are all U or all D may determine the direction in which the interface fine delay code is adjusted. For example, if the signals are all U, then the delay code may be increase (to increase the delay in the interface die). If the signals are all D, then the delay code may be decreased (to decrease the delay in the interface die). After adjusting the delay code, the CFAM enable signals may be checked again. If the enable signals remain all U or all D, then State5 540 may be repeated. If the enable signals are a mix of U and D or all K's, then State6 545 may be entered.

If at least CFAM enable signal is a U and at least one CFAM enable signal is a D, then the state machine may enter the CFAM state State6 545. State6 545 may be entered either from the default maintenance state State4 535 or from the first CFAM state State5 540. The state 545 includes core fine alignment without averaging. In other words, the state 545 may be similar to the state 520. As the core die are adjusted, the state machine may continue to check the status of the CFAM enable signals. If the CFAM enable signals become either all U or all D, then the state machine may transition back to State5 540. If the CFAM enable signals become all K's, then the CFAM modes may be exited and the state machine may return to the default maintenance mode 534. If the CFAM signals continue to be a mix of U and D, then the state machine may remain in the state 545.

FIG. 6 is a diagram of example sets of CFAM enable signals which may enable different states in a maintenance mode according to some embodiments of the present disclosure. The diagram 600 shows four example sets of CFAM enable signals. Each of the sets 610-640 is laid out as a table with the rows showing the different slices or core dies and the columns representing a state of the CFAM enable signal.

The set 610 shows an 'all U' state where most of the slices are in the K state (e.g., not detecting a systemic change, but all the slices which have deviated from the K state are in the U state. In this example Slice0 and Slice5 are in the U state, while all the other slices are in the K state. The set 630 shows an 'all D' state where any of the slices which do not have a K state are in the D state. In the example of the set 630, the slices Slice0, Slice2, and Slice5 all have a D state. The sets 610 and 630 may represent conditions which lead to the state machine entering State5.

The set 620 represents a state where there is a mix of U and D states. The set 620 may lead the state machine to enter State6. The set 640 represents a situation where all of the slices have a CFAM enable signal in the K state. The set 640 may cause the state machine to exit the CFAM states and return to State4, the default maintenance state.

In some embodiments, the sets 610-630 may represent a progression of a memory device as the states are adjusted. For, example, the device may be in State4 when the CFAM enable signals reach set 610. Responsive to that the state machine enters State5 and adjusts the interface die fine delay code up by one. That may cause the device to enter a situation represented by the set 620, where Slice2 moves from a K to a D state. Responsive to that, the state machine may move the State6 and begin adjusting the Core die delay codes. That may shift the memory to a situation represented by set 630, which in turn may move the state machine back to state 5, and so forth until a situation represented by set 640 is reached and the state machine returns to State4.

Figure 7:
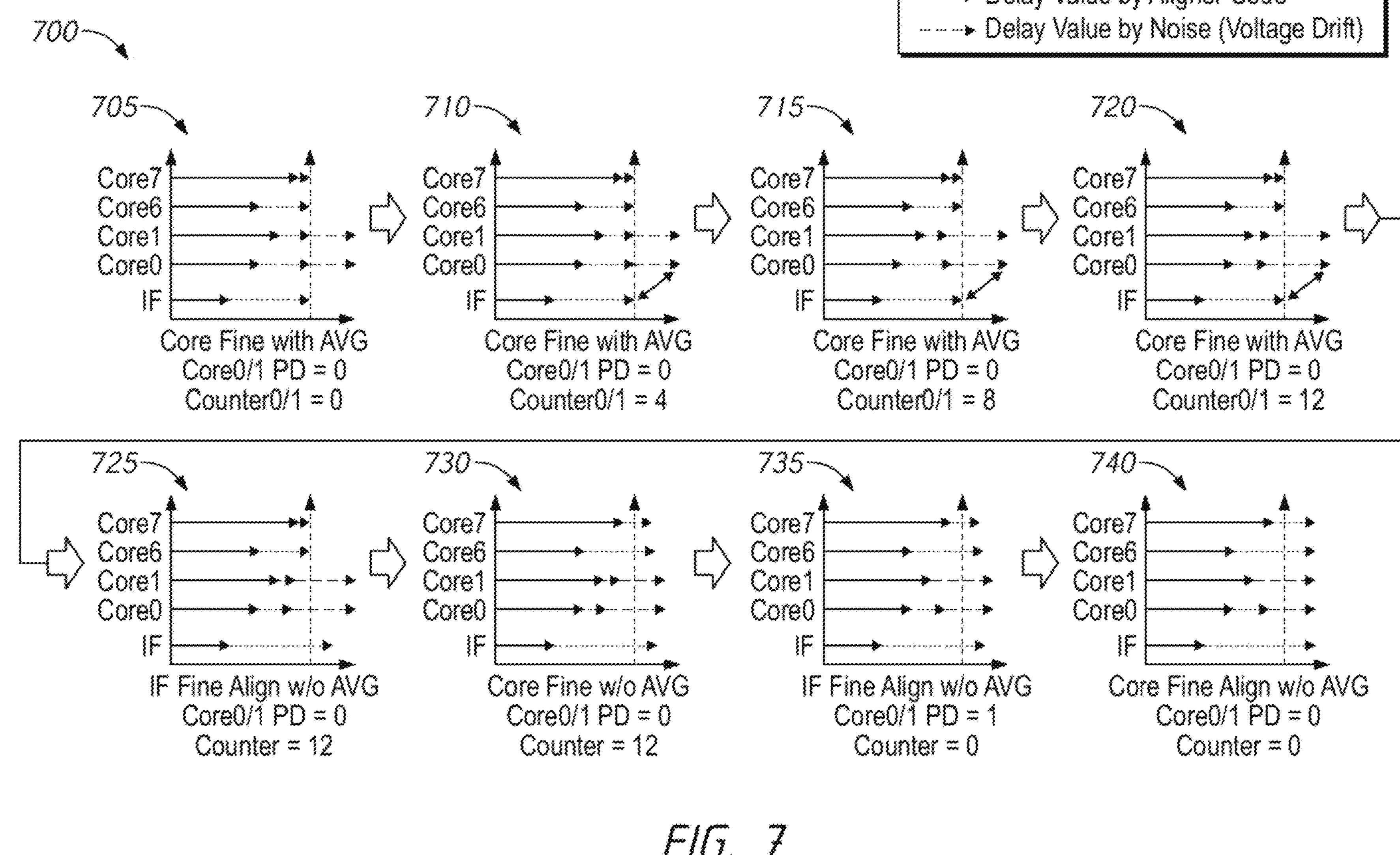
FIG. 7 is a set of graphs which represent an example data alignment procedure according to some embodiments of the present disclosure.

FIG. 7 is a set of graphs which represent an example data alignment procedure according to some embodiments of the present disclosure. The graphs 700 may, in some embodiments, represent a schematic description of delays in a memory device, such as the memory devices 100 of FIG. 1, 200 of FIG. 2, and/or 300 of FIG. 3. In the graphs 700 each graph shows delays in a selected set of core dice of a memory as well as the interface die. In this example, core dice 0, 1, 6, and 7 are shown. Each graph shows a delay in that die represented as a horizontal line, with a longer overall line representing a longer delay in that die. The delays may be broken down into a different components, such as a fixed delay value, which represents an amount of delay intrinsic to that die, and a variable delay added by the aligner delay code. The dotted vertical line represents a level of delay to which the interface and core die were aligned before a voltage drift.

In the example of FIG. 7, a situation is shown where the memory device begins aligned, but voltage drift causes a large change in two of the dies (Core0 and Core1 in this example). The example of FIG. 7 shows how one or more CFAM states (e.g., 540 and/or 545 of FIG. 5) may be used to correct for the voltage drift.

The graph 705 shows an initial state of the memory device. The initial state represents a memory which is in a default maintenance state (e.g., 535 of FIG. 5). The delays are still aligned to a previous alignment level (represented by the vertical dotted line). However, during the initial state of graph 705, a voltage drift has occurred, and there is now a relatively large difference between the alignment level and the actual amount of delay in those die. Since the device is in a default maintenance state, fine adjustment of the core die with averaging is being used to adjust the delay. Accordingly, as may be seen in graphs 710, 715, and then 720, the delay code for the die core0 and core1 is decreased. However, since fine alignment adjustment with averaging is used, the adjustments may be relatively slow.

As shown under the graph 705, when the example of FIG. 7 begins, the CFAM counters for both core die 0 and core die 1 have a value of 0. For example, this may indicate that before the voltage drift represented in graph 705, the variations between the delay of core0 and core1 was random (e.g., so sometimes the signal from the phase detector would be a 0 and sometimes it would be a 1). Starting with the graph 705 and running through 720, the phase detector signals PD for both core0 and core1 may consistently be a '0' to indicate that the delay in the two core die is longer than the delay in the interface die. At the graph 710, sin the PD signals are both 0, and since they were previously 0, then the counter for both of those die may be updated. Since averaging is being used, the counter may be updated by the duration of the averaging window. In this embodiment, an averaging window of 4 periods of the oscillator signal is used, so the count value is increased by 4. Between the graphs 710 and 715, the phase detector signals remain at 0, so the count values for both die is increased by 4 again to a total of 8. Similarly, by graph 720, the count values have been increased again to a total of 12.

In this embodiment, the threshold for CFAM modes is 12, so at the graph 720, the state machine may enter a CFAM mode. In this case, both core die would have a state of 'U' since both of them have a delay which is longer than a delay in the interface die. This may cause the state machine to enter an interface alignment mode without averaging (e.g., State5 540 of FIG. 5). This may cause the delay in the interface die to be increased (e.g., as seen in graph 725). However, the delays in core0 and core1 are still longer than the delay in the interface die, so the PD signals remain at 0. Graph 730 shows the memory entering a core alignment state without averaging (e.g., State6). Here, the delays in core6 and core7 are increased, while the delays in core1 and core0 are decreased. However, the delays of core1 and core0 are still greater than the interface so the PD signals remain at 0. This may move the state machine back to the interface alignment mode (e.g., State5) as shown in Graph 735.

As shown in the graph 735 the delay in the interface die is increased again, and this time the interface die has a delay longer than the core die. This causes the PD signals for core0 and core1 to flip to a '1' and the count values for those two cores to be reset to 0. After State5 is performed for graph 735, the state machine moves back to state 6, as shown in graph 740. Here the core delays are changed again (without averaging), which brings the delays of the memory device into alignment. At this point, the changes between the phases of the core and the interface may generally be random, and the PD signals for core1 and core0 (as well as the others) may fluctuate between a 1 and a 0. This in turn may keep resetting the counters for the different core die, which may put all of their CFAM enable states to a K. Accordingly, after the graph 740, the device may return to a default maintenance state.

Figure 8:
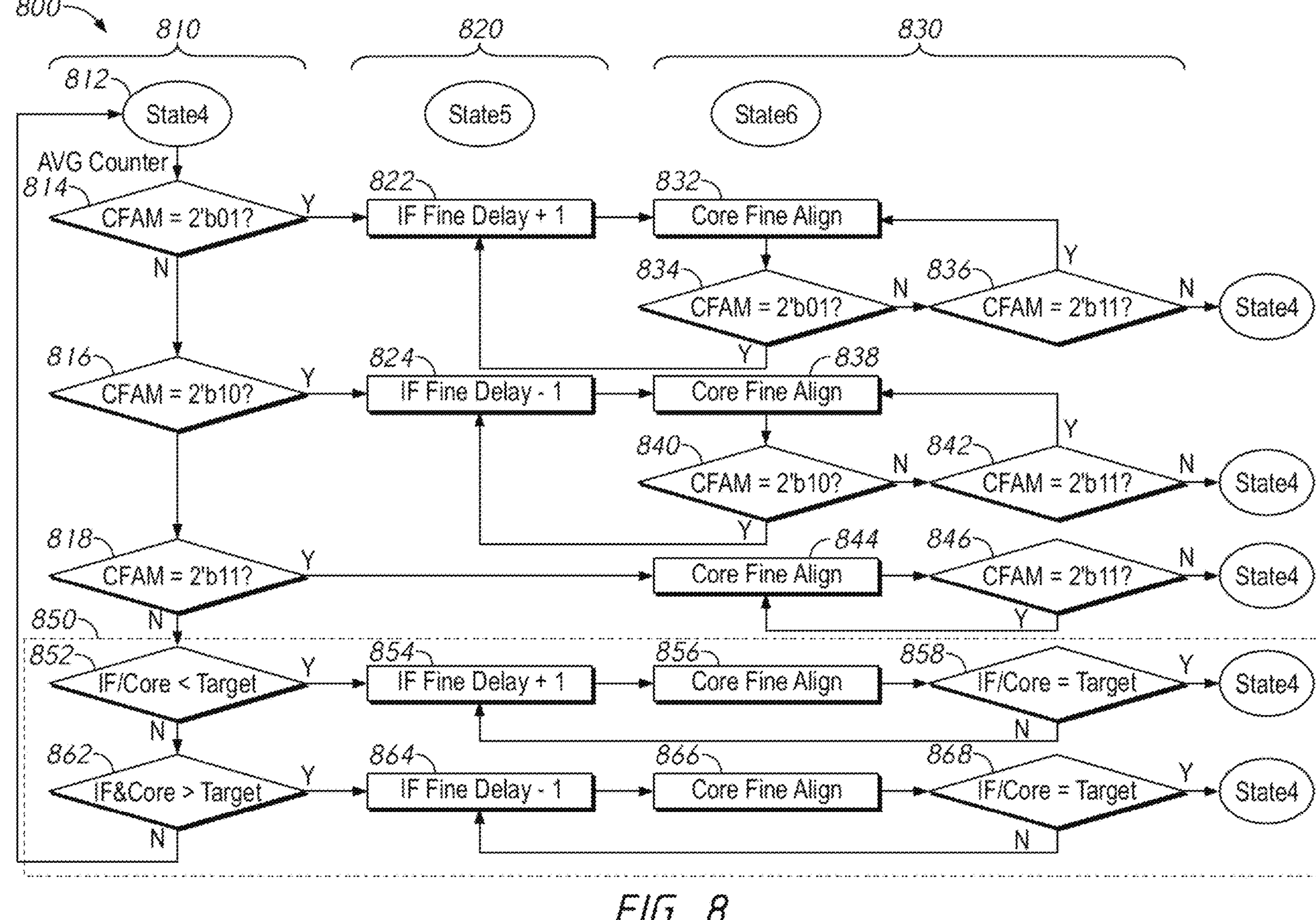
FIG. 8 is a flow chart of a method according to some embodiments of the present disclosure.

FIG. 8 is a flow chart of a method according to some embodiments of the present disclosure. The method 800 may, in some embodiments, represent the operation of a state machine such as the state machine 242 of FIGS. 2 and/or 422 of FIG. 4. In particular, the flow chart 800 represents a state machine which implements the maintenance mode 530 of FIG. 5, as well as the default maintenance mode 535 and the CFAM modes 540 and 545 of that figure. For the sake of consistency, terms such as State4, State5 and State6 will continue to be used, although these states do not necessarily have to be the fourth through sixth states (e.g., if the initialization uses more or fewer states). The method 800 shows various steps that may be performed as part of the default maintenance state 810, as well as the two CFAM states 820 and 830.

FIG. 8 shows an optional target based fast alignment mode (TFAM) represented by box 850. The steps of the TFAM 850 may be an option which may be enabled in some embodiments of the present disclosure. For example, if the TFAM is enabled, the steps of box 850 may be performed. If the TFAM mode is disabled, then the steps of box 850 may be skipped (e.g., and box 818 may return to state 812 if CFAM enable code is not 2'b11 as described herein). In some embodiments, the state machine may not support TFAM at all, and the steps of box 850 may be omitted entirely.

The method 800 begins with a box describing state 814 which is the default maintenance state (e.g., State4). In this box 812 the memory may perform alignment on each of the core die based on the phase detector signal for that core die using averaging. For example, the box 812 may include averaging together a set of PD measurements for each core, and then adjusting a fine portion of the core delay code for that die based on the averaged PD measurements. The box 812 also includes comparing a current (averaged) PD value to a previously stored PD value. The method of box 812 includes adjusting the CFAM counter for that die if the current PD value does match the previous PD value. The method of box 812 includes resetting the CFAM counter for that die if the current PD value does not match the previously stored PD value. The method includes storing the current PD value as the previously stored PD value. The method also includes comparing the CFAM count value to a threshold and setting a value of a CFAM enable signal based on that comparison. For example, if the CFAM count value is below a threshold, the CFAM enable signal may be set to a first value (K). If the CFAM count value is at or above the threshold, then the CFAM enable signal may be set to a second or third value (e.g., U or D) based on a value of the PD signal.

The method includes combining the CFAM enable values for each of the core die to form an overall CFAM enable value. For example, if all of the CFAM enable signals are at a K level, then a first overall CFAM enable value may be used. The overall CFAM enable value may be represented by a code in the memory. For example, CFAM=2'b00 may represent an all K state (e.g., 640 of FIG. 6). Similarly, an all U state (e.g., 610 of FIG. 6) may have a value of CFAM=2'b01, an all D state (e.g., 630 of FIG. 6) may have a value of CFAM=2'b10, and a mix of U and D (e.g., 620 of FIG. 6) may have a value of CFAM=2'b11. Different encoding schemes may be used in other example embodiments.

After performing the steps of the box 812, the method 800 proceeds to box 814. In box 814, the method checks if the overall CFAM value is 2'b01 (e.g., an all U state). If yes, then the method proceeds to box 822, which is part of state5 820. Box 822 describes increasing the interface fine delay code (e.g., incrementing). After box 822, the state machine proceeds to state6 830 and box 832. Box 832 describes performing a core die fine alignment process (without averaging). After performing the alignment of box 832, the method proceeds to box 834, which describes checking to see if the overall CFAM value is still 2'b01 (e.g., still all U). If so, then the method 800 returns to box 822. If not, the method proceeds to box 836, which checks if the overall CFAM value is 2'b11 (e.g., a mix of U and D). If so, then the core alignment of box 832 is performed again. If not, then the method 800 returns to box 812 in the default maintenance state 810.

Returning to box 814, if the overall CFAM value is not 2'b01, then the method proceeds to box 816, which describes checking to see if the overall CFAM value is 2'b10 (e.g., all D). If so, then the method proceeds to box 824 of the CFAM state 820. Box 824 describes decreasing the fine portion of the interface delay code. After performing box 824, the method 800 proceeds to the CFAM state 830 and box 838, which describes performing a core die fine alignment process (without averaging). The process of box 838 may be similar to the box 832. After performing the alignment of box 838, the method proceeds to box 840, which describes checking to see if the overall CFAM value is still 2'b10 (e.g., still all D). If so, then the method 800 returns to box 824. If not, the method proceeds to box 842, which checks if the overall CFAM value is 2'b11 (e.g., a mix of U and D). If so, then the core alignment of box 838 is performed again. If not, then the method 800 returns to box 812 in the default maintenance state 810.

Returning to box 816, if the overall CFAM value is not 2'b10 (e.g., not an all D state), then the method 800 proceeds to block 818, which describes checking to determine if the overall CFAM value is 2'b11 (e.g., a mix of U and D). If so, then the method 800 proceeds to box 844 as part of the state 830, which describes performing a core fine alignment without averaging. Box 844 may be generally similar to the boxes 832 and 838. After performing box 844, the method 800 proceeds to box 846 which describes determining if the overall CFAM value is still 2'b11 or not. If yes, then the method 800 returns to box 844. If not, the method 800 returns to the default maintenance state and box 812.

Returning to box 818, if the overall CFAM value is not 2'b11, then in some embodiments where TFAM is not used, then the method 800 may return to box 812. In some embodiments, the method 800 may include determining if TFAM is enabled. If TFAM is not enabled, then the method 800 may return to box 812. If TFAM is enabled, then the method 800 may proceed to the steps of box 850, specifically to box 852.

Box 852 describes determining if the delays in the core and interface die are below a target (e.g., an underflow condition). If so, then the method 800 proceeds to box 854, which describes increasing the interface delay code (e.g., similar to box 822). After box 854, the method 800 proceeds to box 856, which describes a core fine alignment (without averaging) (e.g., similar to box 832, 838, and 844). After the core fine alignment, the method 800 proceeds to box 858, which describes checking to see if the interface and core die meet a target or not. If they do not, then the method returns to box 854. If they do, the method returns to box 812.

Returning to box 852, if there is not an underflow condition, the method 800 proceeds to box 862, which describes checking for an overflow condition, which involves checking to see if the interface and core delays are above a target. If no, then the method returns to box 812. If yes, then the method proceeds to boxes 864, 866, and 868. The boxes 864, 866, and 868 are analogous to the boxes 854, 856, and 858, except the box 864 describes decreasing the interface delay.

Figure 9:
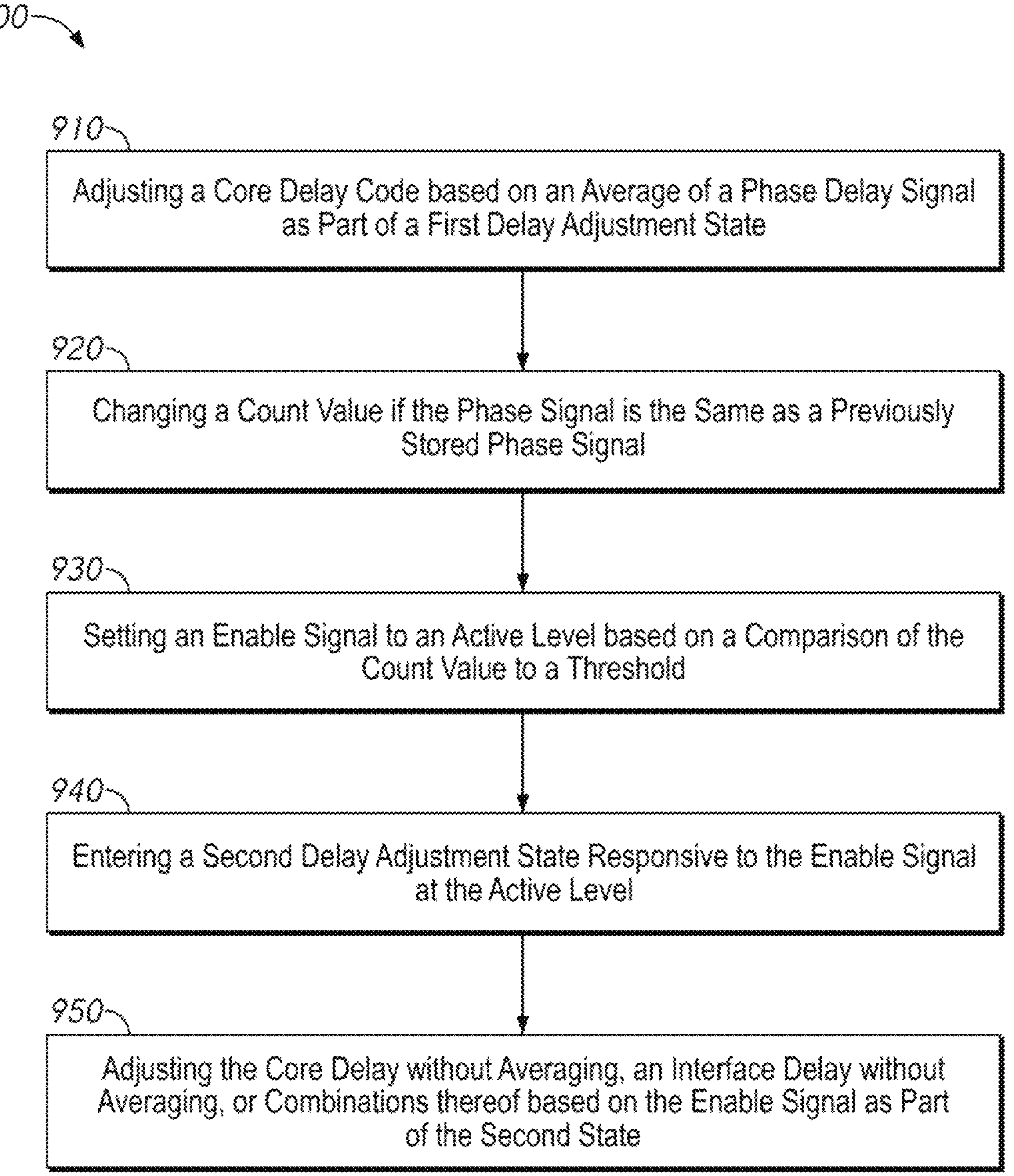
FIG. 9 is a flow chart of a method according to some embodiments of the present disclosure.

FIG. 9 is a flow chart of a method according to some embodiments of the present disclosure. The method 900 may be implemented by one or more of the apparatuses and/or systems described herein. For example, the method 900 may be implemented by the memory devices 100 of FIG. 1, 200 of FIG. 2, and/or 300 of FIG. 3 in some embodiments. The method 900 describes a method of adjusting delays and setting a delay adjustment state as part of an ongoing maintenance adjustment of a memory device (e.g., 530 of FIG. 5). The states used to initialize the delay are not described with respect to FIG. 9. In some embodiments, the initialization states 505-520 of FIG. 5 may occur before the method 900 begins.

The method 900 includes box 910, which describes adjusting a core delay code based on an average of a phase delay signal as part of a first delay adjustment state. The first delay adjustment state may represent a default maintenance state (e.g., State4 535 of FIG. 5) set by a state machine (e.g., 242 of FIG. 2). The method 900 may include generating the phase delay signal based on a phase difference measured between an oscillator signal delayed by a core die (e.g., by core delay circuit 340 of FIG. 3) and an oscillator signal delayed by an interface die (e.g., by interface delay circuit 380 of FIG. 3). The method 900 may include averaging the phase delay signal over time, such as for a number of oscillations of the oscillator signal. In some embodiments, the averaging window may be 4 oscillations, larger or smaller windows may be used.

The steps of box 910 may be followed by box 920, which describes changing a count value if the phase signal is the same as a previously stored phase signal. The method 900 may include comparing the phase signal to a stored phase signal in a register (e.g., 414 of FIG. 4). The method 900 may include increasing the count value responsive to the match between the phase signal and the stored phase signal. In some embodiments, the count value may be increased by a duration of the averaging window when the device is in a delay adjustment state where averaging is used (e.g., the first delay adjustment state). The method 900 may include resetting the count value if there is not a match between the phase signal and the previously stored phase signal. The method 900 may include storing the phase signal as the stored phase signal after the comparing and the changing or resetting of the count value.

The steps of box 920 may generally be followed by box 930, which describes setting an enable signal to an active level based on a comparison of the count value to a threshold. The method 900 may include setting the enable signal to an inactive state (e.g., K) when the count value does not cross the threshold. The method 900 may include setting the enable signal to an active level (e.g., U or D) when the count value crosses the threshold. The method 900 may include setting the enable signal to a first active level or a second active level based on a state of the phase delay signal when the count value crosses the threshold.

The steps of box 930 may generally be followed by the steps of the box 940, which describes entering a second delay adjustment state responsive to the enable signal at the active level. The second delay adjustment state may be a CFAM state (e.g., State5 540 or State6 545 of FIG. 5).

The steps of box 940 may generally be followed by box 950, which describes adjusting the core delay without averaging, an interface delay without averaging, or combinations thereof based on the enable signal as part of the second state. For example, the method may include entering a first CFAM state if all of the active enable signals are a same state (e.g., all U or all D) and adjusting the interface delay without averaging, and the method 900 may include entering a second CFAM state if the active enable signals include a mix of active states (e.g., a mix of U and D) and adjusting the core die delays without averaging. The method 900 may include returning to the first adjustment state if the enable signal becomes inactive (e.g., after the count value is reset).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a core die configured to delay a clock signal and provide a delayed core clock signal; and an interface die configured to delay the clock signal and provide a delayed interface clock, the interface die comprising:

a phase detector configured to provide a phase signal based on the delayed interface clock signal and the delayed core clock signal;

a data aligner configured to receive the phase signal, compare the received phase signal to a stored phase signal and change a count value when the received phase signal matches the stored phase signal, and provide an enable signal at an active level when the count value exceeds a threshold; and a state machine configured to change an operating state to delay the clock signal in the core die based at least in part on the enable signal at the active level.

2. The apparatus of claim 1, wherein the enable signal is configured to enable a core fast alignment mode (CFAM) and the changed operating state comprises a CFAM state.

3. The apparatus of claim 1, wherein the state machine is configured to enter a maintenance mode when the enable signal is not provided at the active level.

4. The apparatus of claim 1, wherein the core die comprises a delay circuit configured to provide the delayed core clock signal based on a core delay code.

5. The apparatus of claim, 4, wherein the core die comprises an aligner circuit configured to provide the core delay code.

6. The apparatus of claim 1, wherein the interface die comprises a delay circuit configured to provide the delayed interface clock based on an interface delay code.

7. The apparatus of claim 6, wherein the data aligner is configured to provide the interface delay code.

8. The apparatus of claim 1, wherein, during the changed operating state, the core die is configured to adjust an amount of delay of the clock signal without averaging values of the phase signal.

9. The apparatus of claim 1, wherein, during the changed operating state, the interface die is configured to adjust an amount delay of the clock signal without averaging values of the phase signal.

10. The apparatus of claim 1, wherein the data aligner is configured to reset the count value when the received phase signal does not match the stored phase signal.

11. A method comprising:

comparing a received phase signal to a stored phase signal;

changing a count value when the received phase signal matches the stored phase signal;

providing an enable signal at an active level when the count value exceeds a threshold; and changing an operating state of a memory device to delay a clock signal in a core die responsive to the enable signal at the active level.

12. The method of claim 11, wherein the changed operating state comprises a core fast alignment mode (CFAM) state.

13. The method of claim 11, further comprising:

entering a maintenance mode when the enable signal is not provided at the active level.

14. The method of claim 11, further comprising:

resetting the count value when the received phase signal does not match the stored phase signal.

15. The method of claim 11, further comprising:

saving the received phase signal for comparison to a next phase signal.

16. The method of claim 11, wherein the enable signal is provided at a first active level or a second active level based on the count value.

17. The method of claim 16, further comprising:

increasing an amount of the delay of the clock signal when the enable signal is provided at the first active level, or decreasing the amount of the delay of the clock signal when the enable signal is provided at the second active level.

18. The method of claim 11, further comprising:

adjusting a core delay of the core die based on an average of the received phase signal.

19. The method of claim 11, further comprising:

adjusting, during the changed operating state, a core delay of the core die without averaging values of the received phase signal.

20. The method of claim 11, further comprising:

adjusting, during the changed operating state, an interface delay of the core die without averaging values of the received phase signal.

* * * * *